United States Patent
Singhal et al.

(10) Patent No.: US 12,307,405 B2
(45) Date of Patent: May 20, 2025

(54) SYSTEM AND METHOD FOR AUTONOMOUS MULTI-BIN PARCEL LOADING SYSTEM

(71) Applicant: Tata Consultancy Services Limited, Mumbai (IN)

(72) Inventors: Aniruddha Singhal, Noida (IN); Harshad Khadilkar, Thane West (IN); Venkat Raju Chintalapalli Patta, Bangalore (IN); Deepak Raina, Noida (IN); Venkatesh Srinivas Prasad, Bangalore (IN); Shivam Thukral, Noida (IN); Rajesh Sinha, Noida (IN); Richa Verma, Noida (IN)

(73) Assignee: Tata Consultancy Services Limited, Mumbai (IN)

( * ) Notice: Subject to any disclaimer, the term of this patent is extended or adjusted under 35 U.S.C. 154(b) by 960 days.

(21) Appl. No.: 17/167,999

(22) Filed: Feb. 4, 2021

(65) Prior Publication Data
US 2021/0253376 A1 Aug. 19, 2021

(30) Foreign Application Priority Data
Feb. 5, 2020 (IN) .............................. 202021005053

(51) Int. Cl.
*G06Q 10/083* (2024.01)
*B65G 65/00* (2006.01)
(Continued)

(52) U.S. Cl.
CPC ......... *G06Q 10/083* (2013.01); *B65G 65/005* (2013.01); *G06F 30/27* (2020.01);
(Continued)

(58) Field of Classification Search
CPC .... G06Q 10/083; G06Q 10/087; G06Q 10/04; G06Q 50/28; B65G 65/005; B65G 2814/0304; G06F 30/27; G06N 5/01
See application file for complete search history.

(56) References Cited

U.S. PATENT DOCUMENTS

2018/0237235 A1* 8/2018 Justesen ............... B25J 15/0014
2018/0341913 A1* 11/2018 Ching ................ G06Q 10/0832
(Continued)

FOREIGN PATENT DOCUMENTS

CN 111404747 A 7/2020

OTHER PUBLICATIONS

Duan, Lu et al., "A Multi-Task Selected Learning Approach for Solving 3D Flexible Bin Packing Problem", Proc. of the 18th International Conference on Autonomous Agents and Multiagent Systems (AAMAS 2019), 18 pages, May 2019, https://arXiv.1804.06896v3.

Wang, Fan et al., "Stable bin packing of non-convex 3D objects with a robot manipulator", Amazon Research Award, 9 pages, Dec. 10, 2018, https://arxiv.org/abs/1812.04093v1.
(Continued)

*Primary Examiner* — Ryan F Pitaro
*Assistant Examiner* — Pursottam Giri
(74) *Attorney, Agent, or Firm* — Finnegan, Henderson, Farabow, Garrett & Dunner, LLP (57) ABSTRACT

State of the art automated bin packing systems fail to handle dynamic scenarios in which information on dimensions of objects to be loaded is not available in advance. These systems also fail to consider capabilities of robots used for the automated packing of objects/bins. The disclosure herein generally relates to automated bin packing, and, more particularly, to a system and method for autonomous multi-bin parcel loading system. The system handles an online object packing in which information on dimensions of objects to be loaded is not available in advance. The system is also configured to consider capabilities of one or more robots
(Continued)

used for loading objects to containers, while generating recommendations for object packing.

8 Claims, 10 Drawing Sheets

(51) Int. Cl.
*G06F 30/27* (2020.01)
*G06N 5/01* (2023.01)
*G06Q 10/087* (2023.01)

(52) U.S. Cl.
CPC ....... *G06N 5/01* (2023.01); *B65G 2814/0304* (2013.01); *G06Q 10/087* (2013.01)

(56) References Cited

U.S. PATENT DOCUMENTS

| | | | |
|---|---|---|---|
| 2019/0276176 A1* | 9/2019 | Almogy | B65B 5/101 |
| 2020/0223634 A1* | 7/2020 | Arase | B25J 19/021 |
| 2021/0129334 A1* | 5/2021 | Kanunikov | B25J 9/1671 |

OTHER PUBLICATIONS

Hu, Haoyuan et al., "Solving a New 3D Bin Packing Problem with Deep Reinforcement Learning Method", Artificial Intilligence Dept, Zhegiang cainiao Supply Chain Management Co., 7 pages, Aug. 20, 2017, https://arxiv.org/abs/1708.05930.

Zhao, Hang et al, "Online 3D Bin Packing with Constrained Deep Reinforcement Learning", Association for the Advancement of Artificial Intelligence, 16 pages, Jan. 2, 2021, https://arxiv.org/abs/2006.14978.

* cited by examiner

| 0 | 0 | 0 | 0 | 0 |
|---|---|---|---|---|
| 0 | 0 | 0 | 0 | 0 |
| 0 | 0 | 0 | 0 | 0 |

+

| 5 | 5 | 5 |
|---|---|---|
| 5 | 5 | 5 |

↓

| 5 | 5 | 5 | 0 | 0 |
|---|---|---|---|---|
| 5 | 5 | 5 | 0 | 0 |
| 0 | 0 | 0 | 0 | 0 |

FIG. 6

SYSTEM AND METHOD FOR AUTONOMOUS MULTI-BIN PARCEL LOADING SYSTEM

PRIORITY CLAIM

This U.S. patent application claims priority under 35 U.S.C. § 119 to: India application No. 202021005053, filed on Feb. 5, 2020. The entire contents of the aforementioned application are incorporated herein by reference.

TECHNICAL FIELD

This disclosure relates generally to automated bin packing, and more particularly to a system and method for autonomous multi-bin parcel loading system.

BACKGROUND

Many industrial applications involve packing of objects. Stacking cargo in a semitruck, loading airplanes, placing chips on circuit boards are some examples. A 3D (3-dimensional) bin packing is a type of packing approach where a set of n number of the 3D (3-dimensional) boxes and an unlimited number of containers (bins) are given, and packaging is done such that the containers are efficiently filled. When it comes to efficiently filling the containers, requirement is that the boxes are packed into minimum number of containers. The 3D (3-dimensional) bin packing is a classical NP-hard (Nondeterministic Polynomial-time hard) problem. Further, designing practical and efficient approaches to the problem is a challenge. The performance of the 3D (3-dimensional) bin packing algorithm is largely affected by the strategy of packing boxes and the techniques used in minimizing wasted space.

Conventionally, several methods have been used to solve the 3-dimensional (3D) bin packing problem. Depending on the problem requirements, the techniques may attempt to minimize wasted space, minimize number of containers, maximize profit, or stabilize balance of the containers. Further, a number of methods have been reported in literature for solving the standard (offline) 3D-BPP (3D bin packing problem), wherein the complete set of objects to be packed is known apriori. A few examples of such methods are integer linear programming space minimizing heuristics, genetic algorithms, and machine learning based smart heuristic selection.

The inventors here have recognized several technical problems with such conventional systems, as explained below. One disadvantage of such methods is that they fail to perform the bin packing in a dynamic scenario i.e. when information on dimensions of the containers are not available beforehand. Dynamic bin packing scenarios addressed in some of the prior art references appear to be disclosing mere capability to change a decided packing sequence, hence the term 'dynamic packing' is used in a completely different context. Also, in automated packing scenario, picking and packing is handled by robotic arms. Such robotic arms are to execute packing strategies decided by the packing methods adopted. Each such robotic arms has specific capabilities and limitations in terms of the actions that can be performed. In some scenarios, the robotic arm used may not be able to execute the decided packing strategy, due to limitations/physical constraints.

SUMMARY

Embodiments of the present disclosure present technological improvements as solutions to one or more of the above-mentioned technical problems recognized by the inventors in conventional systems. For example, in one embodiment, a processor implemented method of object packing is provided. In this method, a current state of a first Long Distance Container (LDC) in which an object is to be packed is obtained, via one or more hardware processors. Further, dimensions of the object to be packed are obtained, via the one or more hardware processors. A plurality of locations in the first LDC where the object can be placed are determined for different orientations of the object, via the one or more hardware processors. Further, a plurality of future states of the first LDC for placement of the object in the plurality of the determined locations for the different orientations of the object, are determined via the one or more hardware processors. Further, it is determined if any of the plurality of future states is a state that satisfies at least one pre-defined condition with respect to packing of objects, via the one or more hardware processors. If any of the future state has been determined as satisfying the pre-defined condition, then corresponding orientation and location are determined via the one or more hardware processors, and then the object is loaded to the first LDC, based on the determined orientation and location, via the one or more hardware processors.

In another embodiment, a system for object packing is provided. The system includes one or more hardware processors, a communication interface, and a memory storing a plurality of instructions. The plurality of instructions when executed, cause the one or more hardware processors to initially obtain a current state of a first Long Distance Container (LDC) in which an object is to be packed. Further, the system obtains dimensions of the object to be packed, via the one or more hardware processors. A plurality of locations in the first LDC where the object can be placed are determined for different orientations of the object, via the one or more hardware processors. Further, a plurality of future states of the first LDC for placement of the object in the plurality of the determined locations for the different orientations of the object, are determined via the one or more hardware processors. Further, it is determined if any of the plurality of future states is a state that satisfies at least one pre-defined condition with respect to packing of objects, via the one or more hardware processors. If any of the future state has been determined as satisfying the pre-defined condition, then corresponding orientation and location are determined via the one or more hardware processors, and then the object is loaded to the first LDC, based on the determined orientation and location, via the one or more hardware processors.

In yet another embodiment, a non-transitory computer readable medium for object packing is provided. The non-transitory computer readable medium includes a plurality of instructions, which when executed, cause one of more hardware processors to perform the object packing by executing the following steps. Initially, a current state of a first Long Distance Container (LDC) in which an object is to be packed is obtained, via the one or more hardware processors. Further, dimensions of the object to be packed are obtained, via the one or more hardware processors. A plurality of locations in the first LDC where the object can be placed are determined for different orientations of the object, via the one or more hardware processors. Further, a plurality of future states of the first LDC for placement of the object in the plurality of the determined locations for the different orientations of the object, are determined via the one or more hardware processors. Further, it is determined if any of the plurality of future states is a state that satisfies at least one pre-defined condition with respect to packing of objects, via the one or more hardware processors. If any of the future state has been determined as satisfying the pre-defined condition, then corresponding orientation and location are determined via the one or more hardware processors, and then the object is loaded to the first LDC, based on the determined orientation and location, via the one or more hardware processors.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

Figure 1:
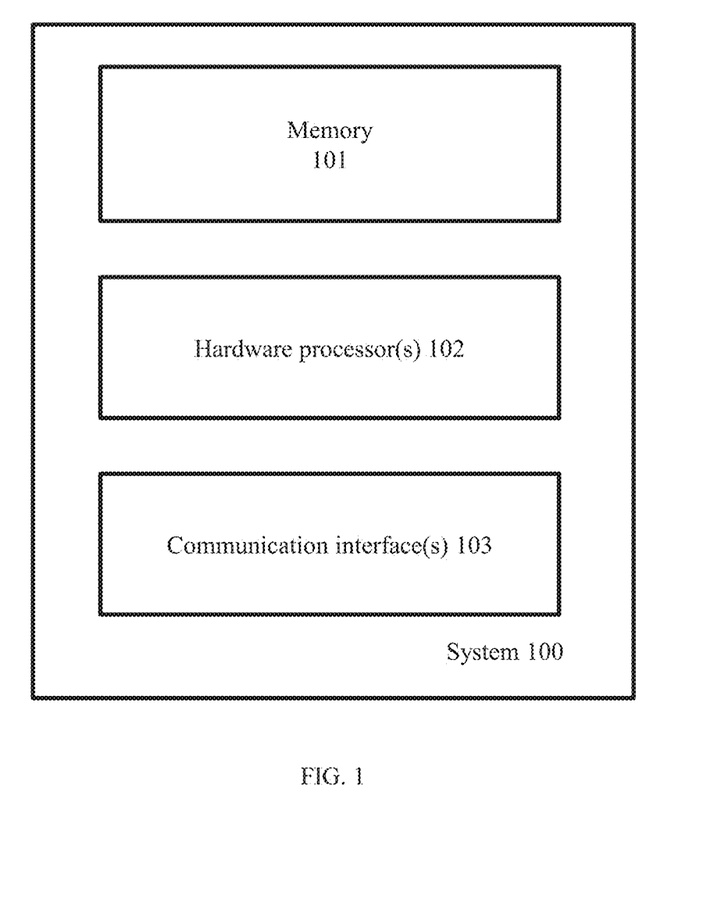
FIG. 1 illustrates a system for automated bin packing, according to some embodiments of the present disclosure.

FIG. 1 illustrates a system for automated bin packing, according to some embodiments of the present disclosure. The system 100 includes one or more hardware processors 102, communication interface(s) or input/output (I/O) interface(s) 103, and one or more data storage devices or memory 101 operatively coupled to the one or more hardware processors 102. The one or more hardware processors 102 can be implemented as one or more microprocessors, microcomputers, microcontrollers, digital signal processors, central processing units, state machines, graphics controllers, logic circuitries, and/or any devices that manipulate signals based on operational instructions. Among other capabilities, the processor(s) are configured to fetch and execute computer-readable instructions stored in the memory. In an embodiment, the system 100 can be implemented in a variety of computing systems, such as laptop computers, notebooks, hand-held devices, workstations, mainframe computers, servers, a network cloud and the like.

The communication interface(s) 103 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the communication interface(s) 103 can include one or more ports for connecting a number of devices to one another or to another server.

The memory 101 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In an embodiment, one or more components (not shown) of the system 100 can be stored in the memory 101. The memory 101 is configured to store a plurality of operational instructions (or 'instructions') which when executed cause one or more of the hardware processor(s) 102 to perform various actions associated with the process of automated bin packing being performed by the system 100. The system 100 can be implemented in a variety of ways as per requirements. Various steps involved in the process of the automated bin packing being performed by the system 100 of FIG. 1 are depicted in FIG. 2, and are explained with reference to the hardware components depicted in FIG. 1 and FIG. 3.

Figure 2A:
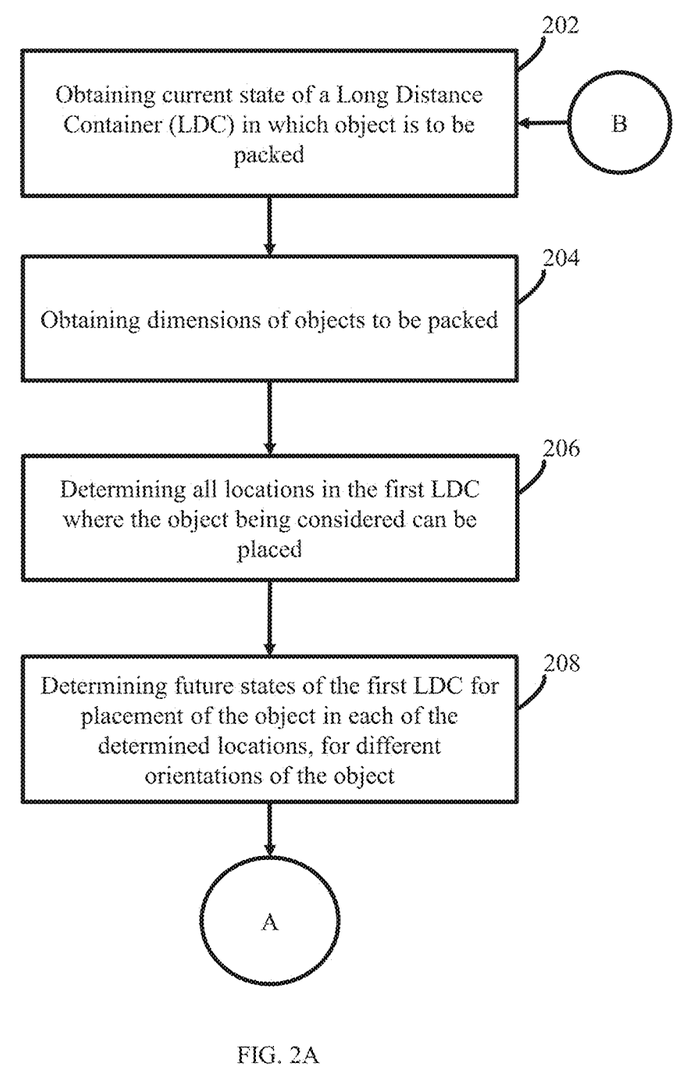
FIGS. 2A and 2B (collectively referred to as FIG. 2) is a flow diagram depicting steps involved in the process of bin packing, using the system of FIG. 1, in accordance with some embodiments of the present disclosure.
Figure 2B:
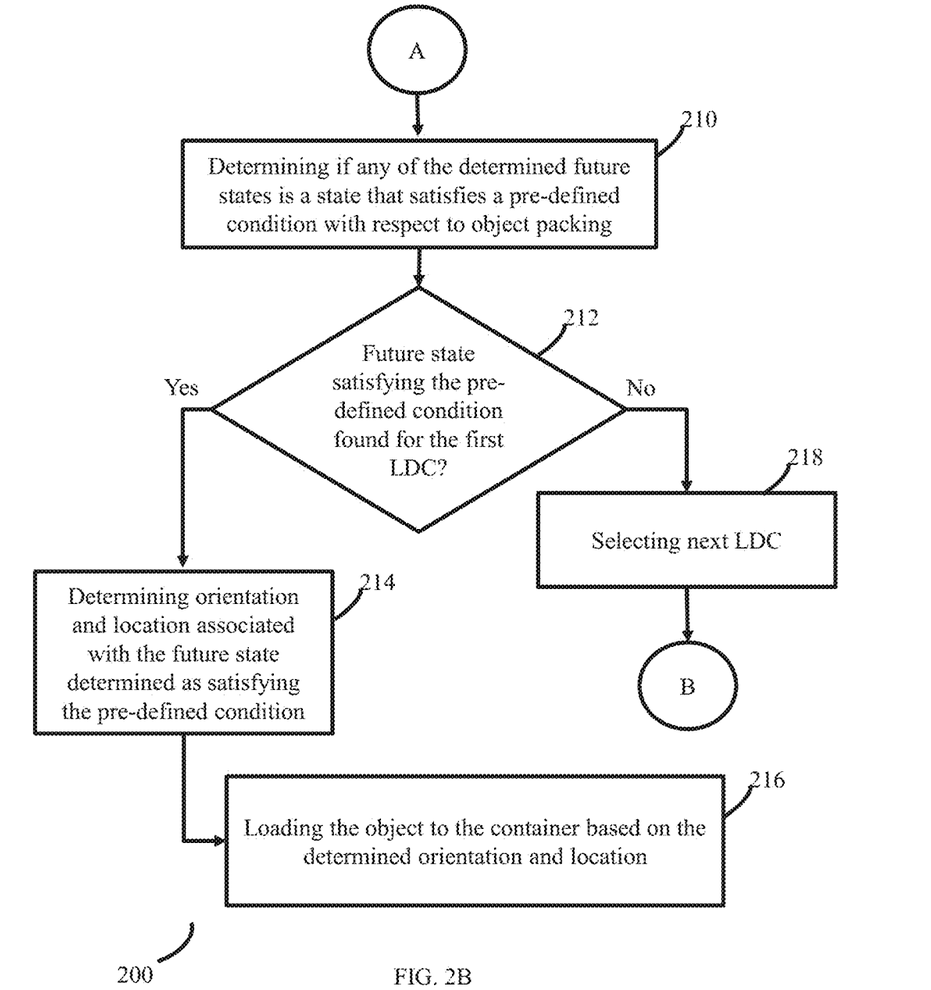
Figure 3:
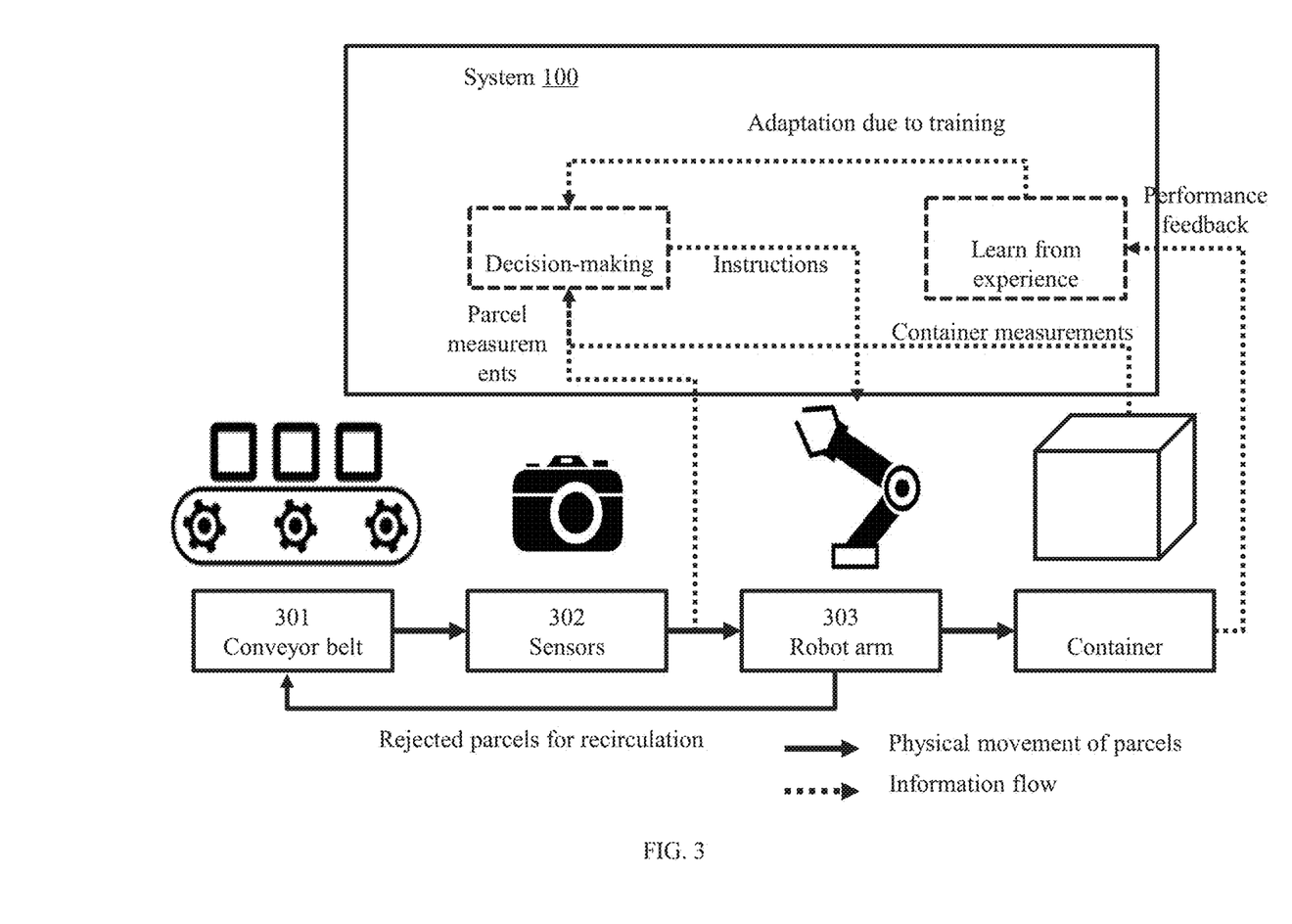
FIG. 3 is a block diagram depicting implementation of the system of FIG. 1 in a real-time scenario, according to some embodiments of the present disclosure.

FIGS. 2A and 2B (collectively referred to as FIG. 2) is a flow diagram depicting steps involved in the process of bin packing, using the system of FIG. 1, in accordance with some embodiments of the present disclosure. An example of the automated bin packing scenario is depicted in FIG. 3. As depicted in FIG. 3, the system 100 may be configured to oversee the bin packing process and thereby generate recommendations for packing incoming bins to one or more available Long Distance Containers (alternately referred to as LDC/container). It is to be noted that the terms 'bin', 'object', and 'box' are used interchangeably throughout the description. Apart from the system 100, the automated bin packing system in FIG. 3 includes a conveyor belt 301, a plurality of sensors 302, and a robot arm (robotic arm) 303.

The conveyor belt 301 is used to transport/carry the cuboidal parcels of arbitrary dimensions during the parcel loading. The cuboidal parcels are alternately referred to as objects or bins in the packing scenario. The plurality of sensors 302 are configured to measure values of various parameters such as but not limited to size of each of the incoming boxes along all three dimensions, and their weights. The robot arm 306 is configured to load the parcel into the container, which involves the robot arm 306 picking up each object and placing inside the container.

The system 100 is configured to generate suggestions/recommendations in terms of location in the container where each of the objects can be placed, and orientation of each of the objects while placing at the suggested location. The system 100 generates the recommendations for placing each of the objects by executing the sequence of steps in method 200, which are explained below.

The method 200 used by the system 100 for generating the bin packing recommendations is based on reinforcement learning approach. In an embodiment, the packing recommendations are generated such that location suggestion for each object coincides with corner locations. In another embodiment, the recommendations also depend on constraints imposed by the hardware system i.e. of the robotic arm used for picking and placing the objects in the containers. A few examples of such constraints are, but not limited to, gripping capability, accuracy, and degrees of freedom of robotic arm. Taking the capabilities/constraints of the robotic arm into consideration while generating the recommendations, helps ensure that the robotic arm can execute/perform the picking and placing of the objects as per the recommendations. For example, in a scenario in which the robotic constraints are not considered while generating the recommendations, the robotic arm may fail to execute the picking and placing of the objects as per the recommendations, as the recommendations may require the robotic arm to, for example, tilt the object by certain degrees, which the robotic arm may not be able to do as it does not have capability to perform the tilting of the object, at least in to the extent specified (in terms of degree) in the recommendation.

At step 202, the system 100 obtains a current state of a container in which the objects are to be packed. In an embodiment, multiple containers may be available at any instance for packing the objects, and one of the available containers is considered for object loading at a time. The container that is initially considered for object loading is referred to as 'first LDC' for explanation purpose. At step 204, the system 100 obtains dimensions of an object to be packed. In an embodiment, multiple objects may be loaded on the conveyor belt at once. Out of the multiple objects, the system 100 may be configured to consider objects on a First Come First Serve basis i.e. the object that is on the front line of the conveyor belt at any instance is considered by the system 100 as the object to be packed. The dimensions obtained by the system 100 may contain information on Length, Width, and Breadth (L, B, W) of the object. The system 100 uses one or more of the plurality of sensors 302 to measure and obtain the dimensions of the object.

Further, at step 206, the system 100 determines all locations in the first LDC where the object can be placed. The system 100 identifies the locations by comparing the obtained dimensions of the object with dimensions of different slots available in the first LDC. Each time an object is placed in one of the available locations/slots in the first LDC, state of the first LDC changes. At step 208, the system 100 determines future states of the first LDC for placement of the object in each of the locations identified at step 206, for different orientations of the object i.e. the future state is identified for each location-orientation pair. Method of generating the state (state representation) by the system 100 is explained in reference to FIG. 6.

Figure 6:
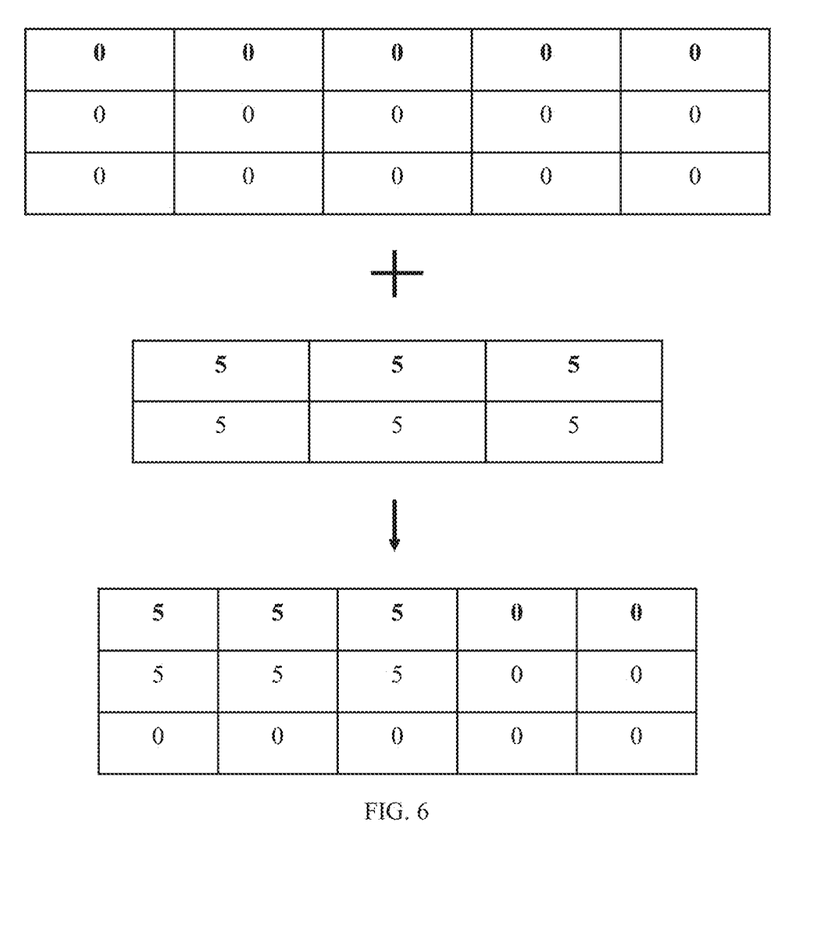
FIG. 6 depicts an example of change of state representation during packing of objects in a container, by the system of FIG. 1, according to some embodiments of the present disclosure.

As depicted in FIG. 6, the system 100 considers a top-down view of T containers that are placed next to each other, and the value of each cell (i,j) is total height of stacked objects in that cell. The number T of containers included in the representation is large enough to fit all possible box sequences, even with poor volume efficiency. A current state of each of the containers is a 2-Dimensional (2D) array with a total of T*L*B grid cells, with the number of cells along each axis dependent on the arrangement of the containers. For experimental purpose, value of T was considered to be 16, and dimension of each of the containers was considered to be 45*80, and that the containers are placed in a row, resulting in a container state dimension of 45*1280.

While using the RL mechanism, in order to keep an RL agent independent of the size of the input, container state is encoded into a fixed-size representation $x^-$. In various embodiments, this representation could be learnt by an autoencoder, or one can directly use pooling functions. During the experiment, three different pooling functions i.e. (i) average pooling, (ii) max pooling, and (iii) the difference between max pooling and min pooling, were considered to reduce any input size to vectors of size 144 each. The vector $x^-$ of size 3*144=432 is expected to indicate to the RL agent, an average height of the underlying receptive fields, as well as its smoothness. Step size of pooling ensures disjoint receptive fields for each element of the vector. In addition, two more input channels also are defined.

A vector $y^-$ is used to encode height of bordering cells of each of the selected locations in the box, in order to indicate how well the object fits with surrounding cells when placed in the identified location. A size of 144 units was used for this representation, with borders smaller than 144 units (depending on perimeter of the box) padded by trailing zeroes, and borders larger than 144 units populated using constant-skip sampling. A vector $z^-$ was used as a one-hot encoding of the receptive field that each of the selected locations belongs to. A Deep Q network (DQN) was used to process this information, wherein $(x^-, y^-, z^-)$ forms input to the DQN. The DQN processes the collected inputs and determines the future states of the first LDC for the placement of the object, for different orientations of the object.

At step 210, the system 100 determines if any of the determined future states is a state that satisfies a pre-defined condition with respect to object packing. In an embodiment, the pre-defined condition is in terms of storage space optimization and the condition is specified with an intention of reducing storage space consumption such that maximum objects can be placed in the LDC container. The system 100 determines an expected storage space utilization resulting from the placement of each object in each location, while considering possible characteristics of future objects to be packed. The system 100 may use any suitable technique, such as but not limited to a Q-Learning algorithm, to determine the expected storage space utilization, and/or any other parameter that forms the pre-defined condition. If any of the future states is determined as satisfying the pre-defined condition, at step 212, then at step 214 the system 100 determines orientation of the object and location/slot in the container where the object needs to be placed, based on location and orientation associated with the future state that has been identified as satisfying the pre-defined condition. Further, at step 216, the object is loaded to the first LDC based on the determined orientation and location.

In another embodiment, if more than one of the plurality of future states satisfy the pre-defined condition, then the system 100 may choose a future state having highest value of compatibility score. In an embodiment, the compatibility score of a future state represents extent to which the future state is matching the pre-defined condition. If none of the future states of the first LDC is satisfying the pre-defined condition, then at step 218 the system 100 selects next LDC and repeats steps from 202 through 216 for the LDC that has been newly selected, till a location and orientation for loading the object is determined. This process is repeated for all the objects.

As the RL based approach is used by the system 100, feedback for each recommendation generated by the system 100 is obtained, and this feedback is used to fine-tune recommendations that are generated at future instances. The system 100 uses a terminal reward function represented as:

$$\varsigma = \frac{V_{packed}}{T_{used}.L.B.H} - \mathcal{T} \quad (1)$$

where $\varsigma$ is packing fraction for the whole sequence (assuming that the number of occupied containers at the end of the each object packing episode is $T_{used}$), and $\mathcal{T}$ is the average packing fraction over all the object packing episodes since the start of training of a RL data model used by the system 100 for generating the recommendations. In an embodiment, capabilities of the robotic arm used for picking and loading the objects to the containers are one of the inputs for training the RL data model, so that the recommendations are generated by the system 100 such that the robotic arm capabilities are taken into consideration, which in turn ensures that the robotic arm 303 can execute all the recommendations generated by the system 100. The terminal reward encourages continuous improvement during the training process. If there are N boxes in a given episode, then the step reward at time step t is given by:

$$r_t = \rho^{N-t}\varsigma \quad (2)$$

where $\rho=0.99$ is a discount factor for the terminal reward function. The entire episode is inserted into a replay buffer after completion and computation of the rewards for each step. The logic for using this reward definition are: (i) to provide a reward based on the results of the entire sequence of decisions/recommendations, and (ii) to speed up training by avoiding the sparse nature of pure terminal reward approaches.

The system 100 carries out the training of the RL model with a mean squared error loss with respect to the relation in (3):

$$Q(s_t, a_t) = (1-\gamma)r_t + \gamma Q(s_{t+1}, a_{t+1}) \quad (3)$$

Where, left-hand side part of (3) is network output and the right-hand side part is target value, produced by a target network (cloned from the online network after every 10 training runs). During the experiments conducted, the training was carried out after every episode with a batch size of 256 (the approximate number of boxes per episode in the training data).

The steps in method 200 may be performed in the same order as depicted in FIG. 2 or in any alternate order technically feasible. Also, one or more steps in method 200 may be omitted if required.

Experimental Results:

During the experiment conducted, the system 100 was trained using synthetically generated data sets, containing boxes of randomly generated dimensions, while making sure that the dimensions match up such that each container can be filled completely (100% fill fraction). Each data set consisted of 10 containers worth of boxes (Opt(I)=10), with the number of boxes ranging between 230 and 370 per episode. The order of upcoming boxes is not known to the system 100, apart from n=2 boxes after the current one. The episode terminates when all boxes are packed, or if the algorithm is unable to pack all boxes in a maximum of 16 containers. The terminal reward (2) is computed based on the number of containers required in each episode.

Training:

During the training, improvement in packing efficiency was verified using a ε-greedy exploration, with ε decreasing linearly from 1 to 0 in 1000 episodes. The algorithm was trained for the last 1000 episodes without exploration, because it was found during the experiments that random decisions early in an episode greatly affect the terminal reward, significantly slowing down the training. The initial packing efficiency of approximately 65% improved steadily to 82% over 1100 episodes, and stayed stable afterwards. The number of bins used decreased from just above 16 to just under 13.

TABLE 1

| Algorithm | Comp. ratio c | Time per box (sec) | Avg. pack | Best pack |
|---|---|---|---|---|
| AH | 1.58 | — | — | — |
| Floor building | 1.52 | 0.0002 | 81% | 05% |
| Column build | 1.46 | 0.0001 | 81% | 06% |
| First Fit | 1.47 | 0.0002 | 81.3% | 07% |
| WallE | 1.41 | 0.0106 | 81.8% | 25% |
| System 100 | 1.29 | 0.0342 | 82.8% | 57% |

Table 1 compares performance of the method used by system 100 with a few state of the art techniques on various parameters including competitiveness ratio metric (c), time taken per loading decision, average packing efficiency, and fraction of test instances in which a given method returned the best packing efficiency. Advanced Harmonic (AH) is known to have a theoretical upper bound of c=1:58, although this is with unconstrained rotation. Empirical results for robot-stackable algorithms show that the method 200 has best empirical ratio of 1.29, averaging $T_{used}$=12.9 bins compared to Opt(I)=10. It also has the highest average packing fraction. While the difference in packing fractions is small, further experiments revealed that this was because there was significant variation among the instances, with some box streams favoring one approach/method over the others. The fact that the method 200 returns the best efficiency in 57% of test cases implied that it retained a significant advantage over other algorithms across a variety of instances.

Figure 4A:
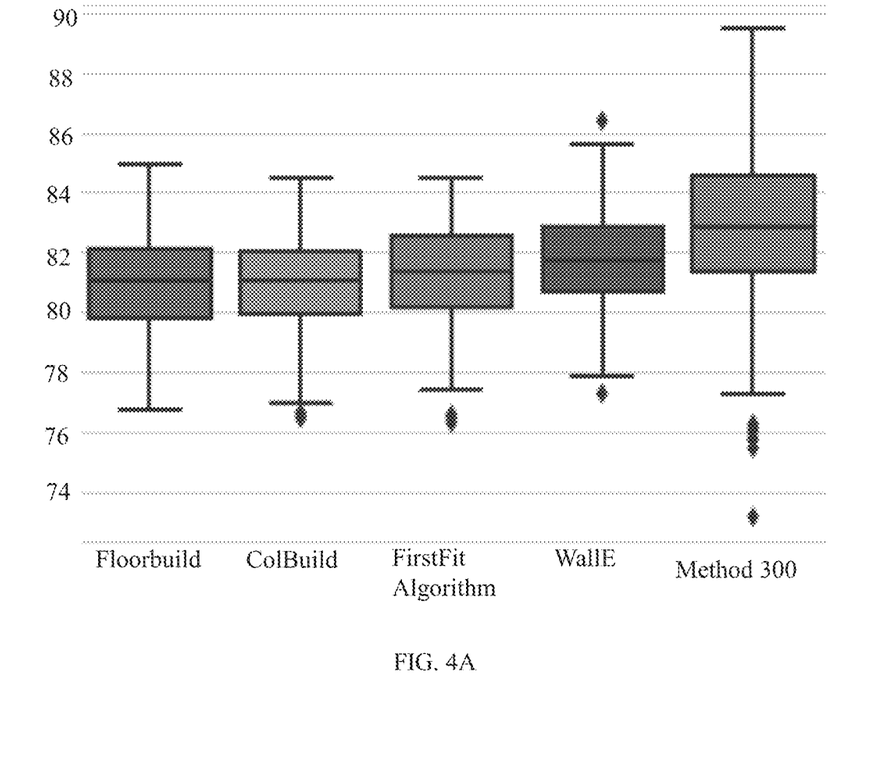
FIGS. 4A and 4B are graphs representing comparison of results obtained using the system of FIG. 1 with results obtained using a plurality of state of the art techniques, according to some embodiments of the present disclosure.
Figure 4B:
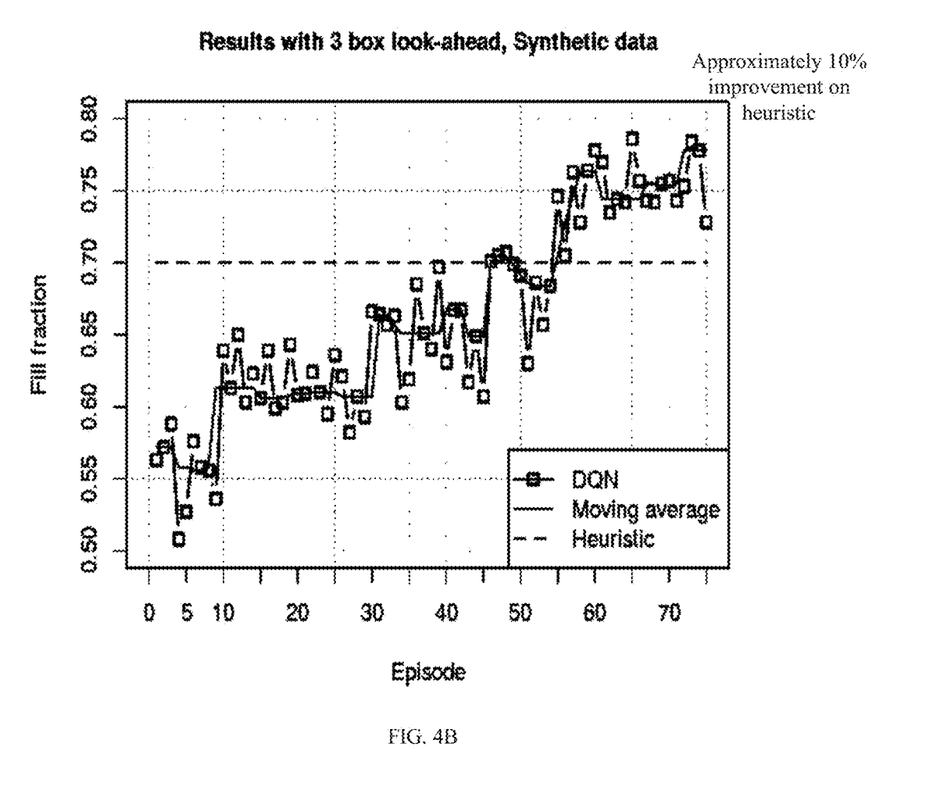

Difference between these approaches is more evident in the box whiskers plot depicted in FIG. 4A. While floor building and column building had nearly identical results for the test data sets, WallE returned the best results among the heuristics. This is a result of its balanced approach to box placement, without a singular emphasis on floor or column building. The median packing efficiency for the method 200 was higher than all the other heuristics, but it had a larger spread in the outliers. However, none of the test runs resulted in the method 200 having a competitive ratio value higher than 1.4 (or 14 bins).

Figure 4C:
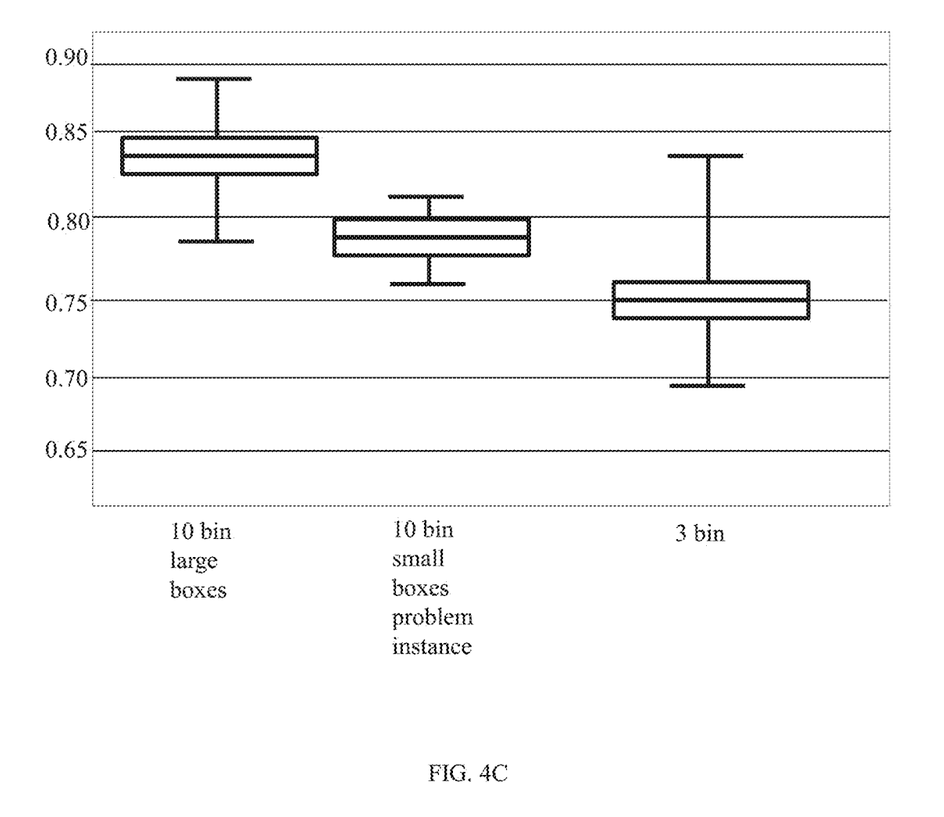
FIG. 4C is a graph representing empirical fill rates for three different problem instances, by the system of FIG. 1, according to some embodiments of the present disclosure.
Figure 4D:
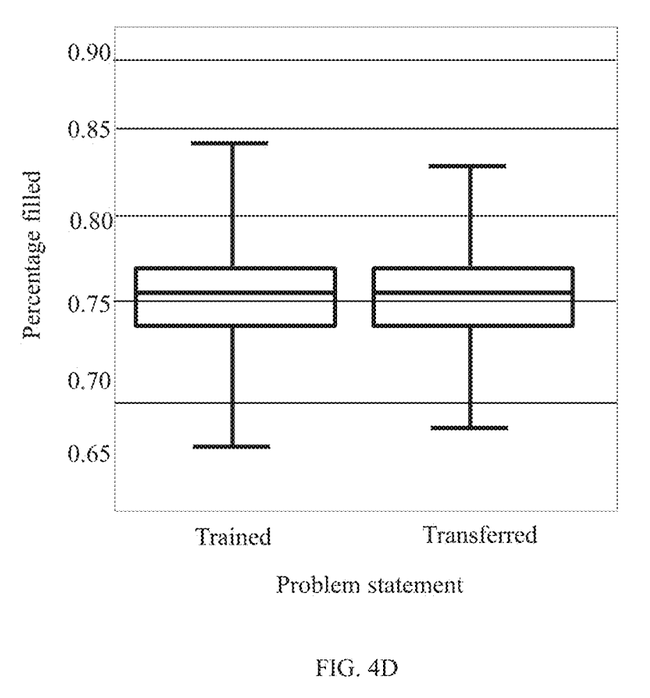
FIG. 4D is a graph representing comparison of empirical fill rates for a 3-bin data set with training on 3-bin data and with weights transferred directly from a 10 bin data set, by the system of FIG. 1, according to some embodiments of the present disclosure.
Figure 5:
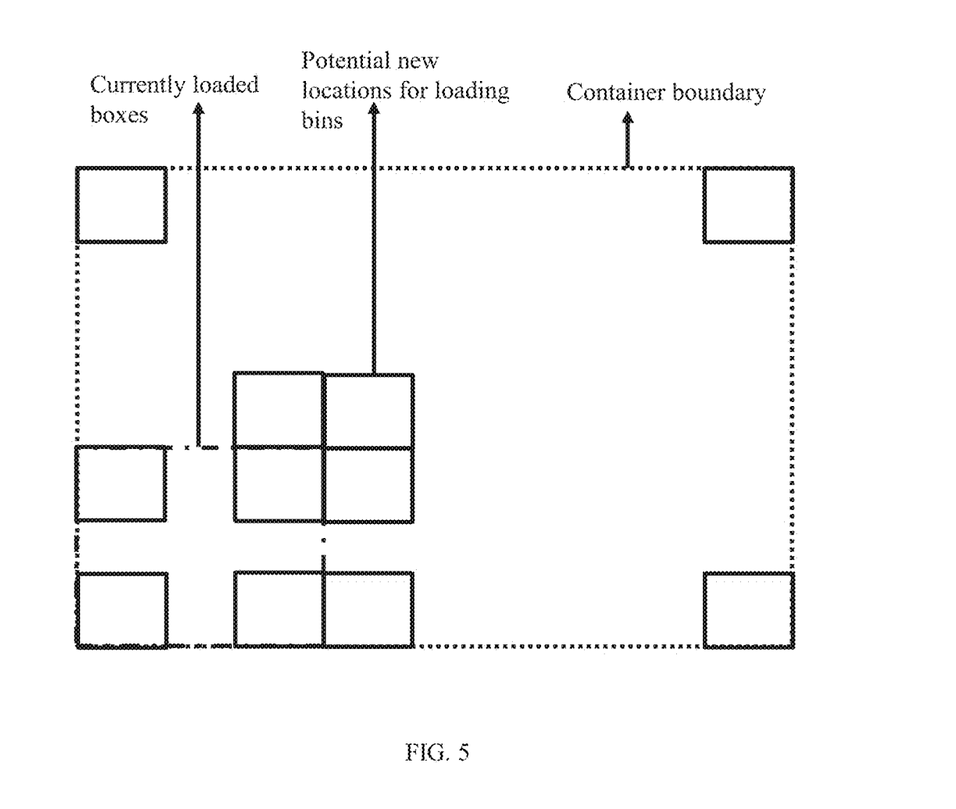
FIG. 5 depicts an example of an object packing scenario being handled by the system of FIG. 1, in which a container, slots already filled, and slots available are depicted, according to some embodiments of the present disclosure.

Goal of the method 200 includes training an RL that works without retraining on other problem instances, whether generated using a different distribution of box dimensions, or a different scale of inputs. During the experiments, the packing efficiency was plotted (FIG. 4C) in two additional types of instances. The left-most box plot is a repeat of the results by the method 200, from FIG. 4A. The box plot in the middle is efficiency of method 200 when boxes have smaller dimensions on average. The underlying random distribution is over smaller dimensions. Even though the total volume is still equivalent to 10 bins, there were roughly double the number of boxes per episode. Since smaller dimensions result in rougher surfaces, the average packing efficiency is lower, but the degradation is small. The right-most box plot in FIG. 4C plots the results on a data set with Opt(I)=3 bins. A maximum of 6 bins were allowed in this case, with a raw input size of 45*(80*6) pixels. It is still mapped to the same vector inputs (x, y, z), and the same model learnt for 16 bins is used without retraining. While the packing efficiency was even lower, this is likely to be a characteristic of these data sets. FIG. 4D shows that the efficiency when the model is trained on 3-bin data sets is nearly the same as that of the model transferred from the 10-bin data set.

Results when System 100 was Deployed in Real-World Scenario:

To monitor and assess performance of the method 200, the system 100 was deployed on a real-time scenario. Most critical challenge in deployment was updating the method 200's belief state according to the containers' actual configuration, which are subject to sensor and actuator noise. Because of this, the objects may not get placed at the exact location dictated by the method 200.

It was observed that the objects collide inside the container during placement due to these errors. To avoid the collision grid size was increased, leaving a space of around 1-2 cm between boxes. Eliminating this space is possible only when the method 200 is updated using millimeter-level accurate real-time measurements. Another challenge was estimation of box orientation and dimension while picking, as any error at this point is carried forward and causes differences.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for packing an object, comprising:

obtaining a current state of a first Long Distance Container (LDC) of a plurality of first Long Distance containers (LDC) in which the object is to be packed, via one or more hardware processors;

measuring, via one or more sensors coupled with the one or more hardware processors, dimensions of the object to be packed, wherein the object to be packed lies on a front line of a conveyor belt;

determining a plurality of locations in the first LDC where the object can be placed with respect to different orientations of the object, via the one or more hardware processors;

processing, using a Deep Q network (DQN), based on the current state of the first LDC;

determining, based on the processed Deep Q network (DQN), a plurality of future states of the first LDC, for placement of the object in the plurality of the determined locations for the different orientations of the object, wherein the plurality of future states are identified for each location-orientation pair, via the one or more hardware processors;

determining whether any of the plurality of future states is a state that satisfies at least one pre-defined condition with respect to packing of the objects, wherein the pre-defined condition is an expected storage space utilization resulting from the placement of the object in the plurality of determined locations for the varied orientations of the object, while considering characteristics of objects yet to be placed, via the one or more hardware processors, wherein the expected storage space utilization is determined using a Q-learning algorithm;

generating, based on the determined expected storage space utilization, object packing recommendations to a robotic arm using a trained reinforcement learning (RL) data model by determining orientation of the object while placing in the first LDC and location where the object yet to be placed in the first LDC, wherein the determined orientation and location are associated with the future state that has been determined as satisfying the at least one pre-defined condition, via the one or more hardware processors, wherein the step of training the RL data model using a terminal reward function ($r_t$) that represented as $$r_t = \rho^{N-\tau} \zeta$$

wherein N is a total number of containers, $\zeta$ is packing fraction for the whole sequence by assuming that a number of occupied containers of the total number of containers at end of the each object packing episode (T), wherein training of the RL model with a mean squared error loss with respect to a relation:

$$Q(s_t, a_t) = (1-\gamma) r_t + \gamma Q(s_{t+1}, a_{t+1}) \quad (1)$$

where, $s_t$ is the current state, $a_t$ is a current action, $s_{t+1}$ is a next state in which RL agent transitions, and $a_{t+1}$ is a next action, where, left-hand side part of (1) is a network output and a right-hand side part of (1) is target value, produced by a target network;

loading, by the robotic arm based on the object packing recommendations, the object to the first LDC, via the one or more hardware processors;

selecting a second LDC when none of the plurality of future states determined for the first LDC is satisfying the pre-defined condition, via the one or more hardware processors;

obtaining feedback data for the object packing recommendations after loading each object to the first LDC based on the determined orientation and location when deployed in real-world scenarios, wherein when the objects collide inside the containers during placement; and fine-tuning the object packing recommendations with respect to placement of the object in a particular location and the orientation of the object, based on the obtained feedback data and the trained RL data model to avoid an object collision by increasing a grid size, leaving space between the containers, and updating the method with millimeter-level accurate real-time measurements.

2. The method as claimed in claim 1, wherein determining the plurality of locations in the first LDC where the object yet to be placed comprises determining all the locations in the first LDC where the object fit in, by considering a) dimension feasibility of the object, b) capability of the robotic arm that is being used for loading the object to the first LDC, and c) stability of a stack of objects in the first LDC, for the different orientations of the object.

3. The method as claimed in claim 1, wherein the method further comprises recurringly performing the repeating steps of opening a new the second LDC and determining the orientation and the location in the second LDC where the object yet to can be placed, if none of the plurality of future states determined for the first LDC satisfies the pre-defined condition, till the future state satisfying the pre-defined condition is identified.

4. A system for packing an object, comprising:
one or more hardware processors;
one or more sensors and a robotic arm coupled with the one or more hardware processors;
a communication interface; and
a memory storing a plurality of instructions, wherein the plurality of instructions when executed, cause the one or more hardware processors to:
obtain a current state of a first Long Distance Container (LDC) of a plurality of first Long Distance containers (LDC) in which the object is to be packed;
measure, via one or more sensors, dimensions of the object to be packed, wherein the object to be packed lies on a front line of a conveyor belt;
determine a plurality of locations in the first LDC where the object can be placed with respect to different orientations of the object;
process, using a Deep Q network (DQN), based on the current state of the first LDC;
determine, based on the processed Deep Q network (DQN), a plurality of future states of the first LDC, for placement of the object in the plurality of the determined locations for the different orientations of the object, wherein the plurality of future states are identified for each location-orientation pair;

determine whether any of the plurality of future states is a state that satisfies at least one pre-defined condition with respect to packing of the objects, wherein the pre-defined condition is an expected storage space utilization resulting from the placement of the object in the plurality of determined locations for the varied orientations of the object, while considering characteristics of objects yet to be placed, wherein the expected storage space utilization is determined using a Q-learning algorithm;

generate, based on the determined expected storage space utilization, an object packing recommendations to the robotic arm using a trained reinforcement learning (RL) data model by determining orientation of the object while placing in the first LDC and location where the object yet to be placed in the first LDC, wherein the determined orientation and location are associated with the future state that has been determined as satisfying the at least one pre-defined condition, wherein the step of training the data model using a terminal reward function ($r_t$) that represented as $$r_t = \rho^{N-\tau} \zeta$$

wherein N is a total number of containers, $\zeta$ is packing fraction for the whole sequence by assuming that a number of occupied containers of the total number of containers at end of the each object packing episode (T), wherein training of the RL model with a mean squared error loss with respect to a relation:

$$Q(s_t, a_t) = (1-\gamma) r_t + \gamma Q(s_{t+1}, a_{t+1}) \qquad (1)$$

where, $s_t$ is the current state, $a_t$ is a current action, $s_{t+1}$ is a next state in which RL agent transitions, and $a_{t+1}$ is a next action, where, left-hand side part of (1) is a network output and a right-hand side part of (1) is target value, produced by a target network;

load, by the robotic arm based on the object packing recommendations, the object to the first LDC;

open a select a second LDC and determines the orientation and location in the second LDC where the object can be place, if none of the plurality of future states determined for the first LDC is satisfying the pre-defined condition;

obtain feedback data for the object packing recommendations after loading each object to the first LDC based on the determined orientation and location when deployed in real-world scenarios, wherein when the objects collide inside the containers during placement; and fine-tune the object packing recommendations with respect to placement of the object in a particular location and the orientation of the object, based on the obtained feedback data and the trained RL data model to avoid an object collision by increasing a grid size, leaving space between the containers, and updating the method with millimeter-level accurate real-time measurements.

5. The system as claimed in claim 4, wherein the system determines the plurality of locations in the first LDC where the object yet to be placed by determining all the locations in the first LDC where the object fit in, for the different orientations of the object.

6. A computer program product comprising a non-transitory computer readable medium having a computer readable instructions embodied therein, wherein the computer readable instructions, when executed, cause to perform packing of an object by:
obtaining a current state of a first Long Distance Container (LDC) of a plurality of first Long Distance containers (LDC) in which the object is to be packed, via one or more hardware processors;
measuring, via one or more sensors coupled with the one or more hardware processors, dimensions of the object to be packed, wherein the object to be packed lies on a front line of a conveyor belt;
determining a plurality of locations in the first LDC where the object can be placed with respect to different orientations of the object, via the one or more hardware processors;
processing, using a Deep Q network (DQN), based on the current state of the first LDC;
determining, based on the processed Deep Q network (DQN), a plurality of future states of the first LDC, for placement of the object in the plurality of the determined locations for the different orientations of the object, wherein the plurality of future states are identified for each location-orientation pair, via the one or more hardware processors;
determining whether any of the plurality of future states is a state that satisfies at least one pre-defined condition with respect to packing of the objects, wherein the pre-defined condition is an expected storage space utilization resulting from the placement of the object in the plurality of determined locations for the varied orientations of the object, while considering characteristics of objects yet to be placed, via the one or more hardware processors, wherein the expected storage space utilization is determined using a Q-learning algorithm;
generating, based on the determined expected storage space utilization, an object packing recommendations to a robotic arm using a trained reinforcement learning (RL) data model by determining orientation of the object while placing in the first LDC and location where the object yet to be placed in the first LDC, wherein the determined orientation and location are associated with the future state that has been determined as satisfying the at least one pre-defined condition, via the one or more hardware processors,
wherein the step of training the data model using a terminal reward function ($r_t$) that represented as $$r_t = \rho^{N-r}\zeta$$

wherein N is a total number of containers,
$\zeta$ is packing fraction for the whole sequence by assuming that a number of occupied containers of the total number of containers at end of the each object packing episode (T),
wherein training of the RL model with a mean squared error loss with respect to a relation:

$$Q(s_t, a_t) = (1-\gamma)r_t + \gamma Q(s_{t+1}, a_{t+1}) \qquad (1)$$

where, $s_t$ is the current state, $a_t$ is a current action, $s_{t+1}$ is a next state in which RL agent transitions, and $a_{t+1}$ is a next action,
where, left-hand side part of (1) is a network output and a right-hand side part of (1) is target value, produced by a target network;
loading, by the robotic arm based on the object packing recommendations, the object to the first LDC, via the one or more hardware processors;
selecting a second LDC when none of the plurality of future states determined for the first LDC is satisfying the pre-defined condition, via the one or more hardware processors;
obtaining feedback data for the object packing recommendations after loading each object to the first LDC based on the determined orientation and location when deployed in real-world scenarios, wherein when the objects collide inside the containers during placement; and
fine-tuning the object packing recommendations with respect to placement of the object in a particular location and the orientation of the object, based on the obtained feedback data and the trained RL data model to avoid an object collision by increasing a grid size, leaving space between the containers, and updating the method with millimeter-level accurate real-time measurements.

7. The computer program product as claimed in claim 6, wherein determining the plurality of locations in the first LDC where the object yet to be placed comprises determining all the locations in the first LDC where the object fit in, by considering a) dimension feasibility of the object, b) capability of the robotic arm that is being used for loading the object to the first LDC, and c) stability of a stack of objects in the first LDC, for the different orientations of the object.

8. The computer program product as claimed in claim 6, wherein bin packing further comprises recurringly performing the repeating steps of opening a new the second LDC and determining the orientation and the location in the second LDC where the object can yet to be placed, if none of the plurality of future states determined for the first LDC satisfies the pre-defined condition, till the future state satisfying the pre-defined condition is identified.

* * * * *